(12) United States Patent
Kasai et al.

(10) Patent No.: US 11,543,445 B2
(45) Date of Patent: Jan. 3, 2023

(54) INSPECTION APPARATUS

(71) Applicant: TOKYO ELECTRON LIMITED, Tokyo (JP)

(72) Inventors: Shigeru Kasai, Nirasaki (JP); Yutaka Akaike, Nirasaki (JP); Hiroyuki Nakayama, Nirasaki (JP); Yoshinori Fujisawa, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 279 days.

(21) Appl. No.: 16/772,547

(22) PCT Filed: Nov. 29, 2018

(86) PCT No.: PCT/JP2018/044009
§ 371 (c)(1),
(2) Date: Jun. 12, 2020

(87) PCT Pub. No.: WO2019/116911
PCT Pub. Date: Jun. 20, 2019

(65) Prior Publication Data
US 2020/0386805 A1    Dec. 10, 2020

(30) Foreign Application Priority Data

Dec. 13, 2017 (JP) ............................. JP2017-239050

(51) Int. Cl.
*G01R 31/26* (2020.01)
*G01N 21/88* (2006.01)
(Continued)

(52) U.S. Cl.
CPC ..... *G01R 31/2601* (2013.01); *G01N 21/8806* (2013.01); *G01N 21/9501* (2013.01);
(Continued)

(58) Field of Classification Search
CPC ...................... G01R 31/2601; G01R 31/2637
See application file for complete search history.

(56) References Cited

U.S. PATENT DOCUMENTS

2011/0254574 A1* 10/2011 Tashiro .............. G01R 31/2887
324/762.01
2018/0330651 A1* 11/2018 Miyatani ................... G09F 9/00

FOREIGN PATENT DOCUMENTS

JP    H09-288143 A    11/1997
JP    2004-153288 A    5/2004
(Continued)

OTHER PUBLICATIONS

PCT International Search Report, PCT Application No. PCT/JP2018/044009, dated Jan. 22, 2019, 8 pages (with English translation of International Search Report).

*Primary Examiner* — Thanh Luu
(74) *Attorney, Agent, or Firm* — Fenwick & West LLP

(57) ABSTRACT

An inspection apparatus is provided to inspect an imaging device formed on an inspection object by bringing a contact terminal into electrical contact with a wiring layer of the imaging device while causing light to enter the imaging device. The light enters the imaging device from a back surface that is a surface on the side opposite to the side on which the wiring layer is formed. The inspection apparatus includes a substrate support made of a light-transmissive material and on which the inspection object is supported such that the substrate support faces a back surface of the imaging device, and a light irradiation mechanism disposed to be opposite to the inspection object with the substrate support interposed therebetween and having a plurality of LEDs such that light from the LEDs is oriented toward the inspection object.

8 Claims, 9 Drawing Sheets

(51) Int. Cl.
*G01N 21/95* (2006.01)
*H01L 27/146* (2006.01)
*F21Y 115/10* (2016.01)

(52) U.S. Cl.
CPC ........ *G01R 31/2637* (2013.01); *H01L 27/146* (2013.01); *F21Y 2115/10* (2016.08)

(56) References Cited

FOREIGN PATENT DOCUMENTS

| | | | |
|---|---|---|---|
| JP | 2005-44853 | A | 2/2005 |
| JP | 2007-71822 | A | 3/2007 |
| JP | 2009-170730 | A | 7/2009 |
| JP | 2011027443 | A * | 2/2011 |
| WO | WO 2014/020713 | A | 2/2014 |

* cited by examiner

INSPECTION APPARATUS

CROSS-REFERENCE TO RELATED APPLICATIONS

The present application claims priority based on Japanese Patent Application No. 2017-239050, filed in Japan on Dec. 13, 2017, the entire contents of which are incorporated herein by reference.

TECHNICAL FIELD

The present disclosure relates to an inspection apparatus for inspecting an imaging device by making electrical contact between the imaging device and a contact terminal while causing light to enter the imaging device.

BACKGROUND

In a semiconductor manufacturing process, a plurality of semiconductor devices, each having a predetermined circuit pattern, is formed on a semiconductor wafer. Electrical characteristics of the semiconductor devices are inspected and the semiconductor devices are classified into non-defective products or defective products. For example, in inspecting the semiconductor devices, the semiconductor wafer is inspected by using an inspection apparatus referred to as a prober or the like before the semiconductor wafer is divided into the semiconductor devices. In the inspection apparatus, a probe card having a plurality of probe needles is disposed above the semiconductor wafer, i.e., the semiconductor devices. In order to perform the inspection, the probe card and the semiconductor devices are made to be close to each other and, then, the probe needles are brought into contact with electrodes of the semiconductor devices. In this state, a test head disposed above the probe card supplies electric signals to the semiconductor devices through the probe needles. Then, the defectiveness of the semiconductor devices is determined based on the electric signals transmitted from the semiconductor devices to the test head through the probe needles.

When each semiconductor device is an imaging device such as a CMOS sensor or the like, the inspection is performed while irradiating light to the imaging device, unlike other general semiconductor devices (see Patent Document 1).

In an inspection apparatus disclosed in Patent Document 1, a light source unit having a light source such as a halogen lamp is disposed above a test head to irradiate light to the imaging device during the inspection. Further, the inspection apparatus disclosed in Patent Document 1 includes an optical system for guiding the light from the light source disposed above the test head to the imaging device disposed below the test head. The probe card of the inspection apparatus disclosed in Patent Document 1 has an opening formed at a position corresponding to the imaging device, and the probe needles are disposed around the opening.

Patent Document 1: Japanese Patent Application Publication No. 2005-44853

The conditions (e.g., the amount of the light) for irradiating light to the imaging device are not the same and vary depending on, e.g., an inspection target. In the case of using a halogen lamp as a light source as described in the inspection apparatus disclosed in Patent Document 1, the amount of light that is the light irradiation condition can be controlled by adjusting a voltage applied to the halogen lamp. However, a certain period of time is required until the amount of light becomes stable. Therefore, in the case of using the halogen lamp as the light source as described in the inspection apparatus disclosed in Patent Document 1, it is necessary to control the light irradiation conditions using the optical system that is complicated and expensive. Further, when the light source is disposed above the test head as described in Patent Document 1, it is necessary to form the opening(s) in the probe card as described above and, thus, the number of probe needles that can be formed at the probe card is limited compared to the case in which the opening(s) is not formed. As a result, the time period for inspection is increased. Particularly, when the number of electrodes to be in contact with the probe needles is increased due to the mounting of memory on the imaging device or the like, the time period for inspection is further increased.

Recently, a back-side illuminated imaging device that receives light incident from a back side opposite to a front side on which a wiring layer is formed has been developed. However, in an inspection apparatus in which probe needles are disposed above the imaging devices to be inspected, when the light source is disposed above the test head as described in Patent Document 1, i.e., when the light is irradiated to the imaging devices (i.e., the inspection targets) from above, it is difficult to inspect the above-described back-side illuminated imaging device.

In view of the above, the present disclosure provides an inspection apparatus capable of inspecting back-side illuminated imaging devices without requiring a complicated optical system and also capable of rapidly performing the inspection.

SUMMARY

In accordance with an aspect of the present disclosure, there is provided an inspection apparatus for inspecting an imaging device formed on an inspection object by bringing a contact terminal into electrical contact with a wiring layer of the imaging device while causing light to enter the imaging device, wherein the light enters the imaging device from a back surface that is a surface on the side opposite to a side on which the wiring layer is formed, the inspection apparatus including: a substrate support made of a light-transmissive material and on which the inspection object is supported such that the substrate support faces the back surface of the imaging device; and a light irradiation mechanism disposed to be opposite to the inspection object with the substrate support interposed therebetween and having a plurality of LEDs such that light from the LEDs is oriented toward the inspection object.

According to the inspection apparatus, the back-side illuminated imaging devices formed on the inspection object can be inspected by the configuration in which the substrate support, on which the inspection object is supported such that the substrate support faces the back surface of the imaging device, is made of the light-transmissive material and light is irradiated from a light irradiation mechanism disposed to be opposite to the inspection object with the substrate support interposed therebetween. Further, by employing such a configuration, the number of the contact terminals is not limited and, thus, the inspection can be performed quickly. In addition, while the light source of the light irradiation mechanism includes the plurality of LEDs, it is not necessary to have a complicated optical system.

Effect

In accordance with the aspect of the present disclosure, the back-side illuminated imaging devices can be quickly inspected without requiring a complicated optical system.

DETAILED DESCRIPTION

Figure 1:
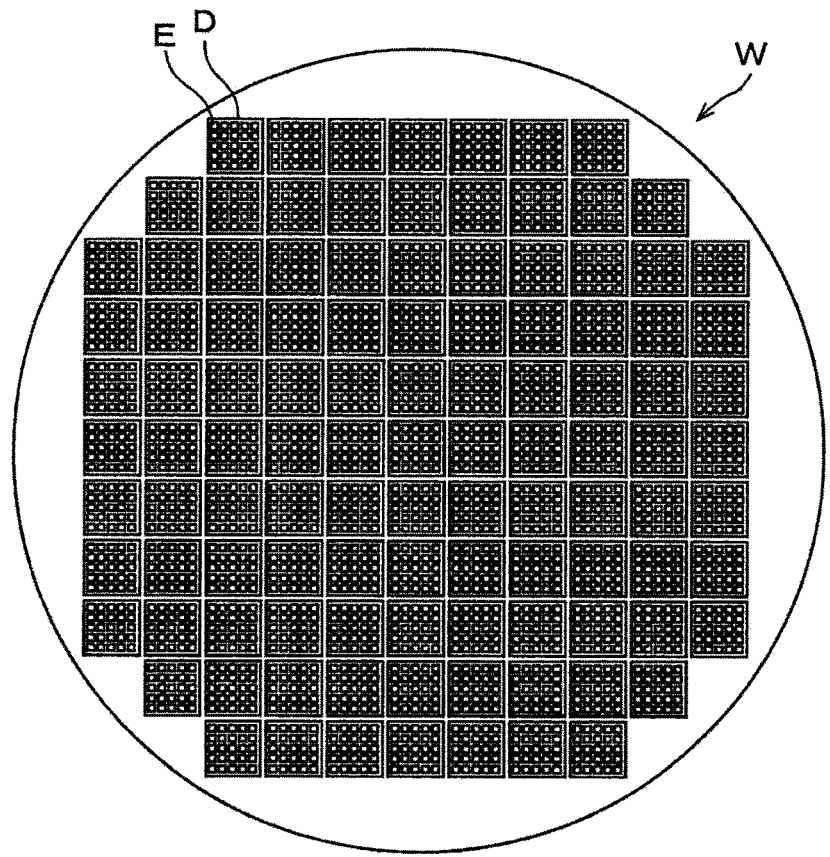
FIG. 1 is a plan view schematically showing a configuration of an inspection object on which back-side illuminated imaging devices are formed.

Hereinafter, embodiments of the present disclosure will be described in detail with reference to the accompanying drawings. Like reference numerals will be given to like parts having substantially the same functions and configurations throughout this specification and the drawings.

Since the inspection apparatus according to the embodiment of the present disclosure is configured to inspect a back-side illuminated imaging device, the back-side illuminated imaging device will be described first.

Figure 2:
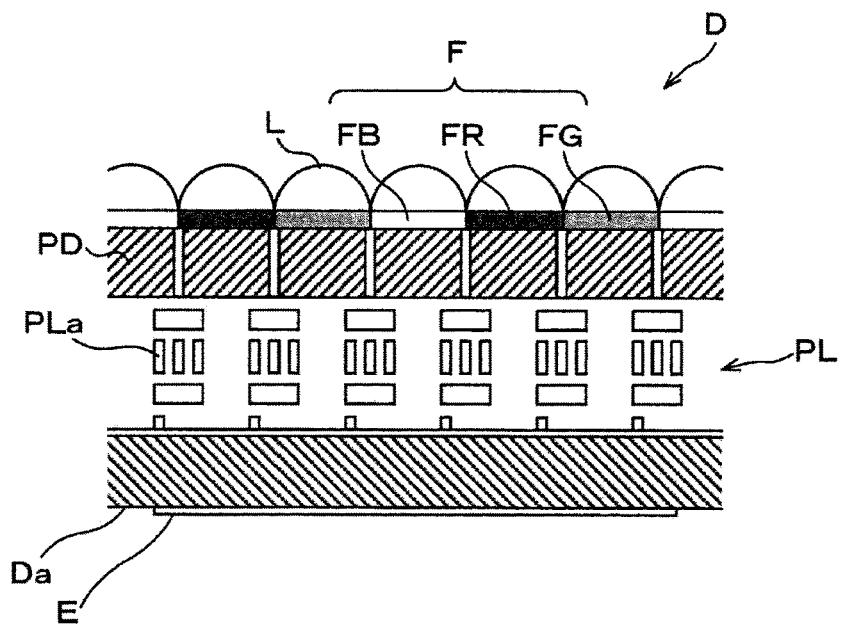
FIG. 2 is a cross-sectional view schematically showing a configuration of the back-side illuminated imaging device.

FIG. 1 is a plan view schematically showing a configuration of a semiconductor wafer (hereinafter, referred to as "wafer") as an inspection object on which back-side illuminated imaging devices are formed. FIG. 2 is a cross-sectional view schematically showing a configuration of each back-side illuminated imaging device.

As shown in FIG. 1, a plurality of back-side illuminated imaging devices D is formed on a substantially disk-shaped wafer W.

Each back-side illuminated imaging device D is a solid-state imaging device. As shown in FIG. 2, the back-side illuminated imaging device D includes a photoelectric conversion unit PD that is a photodiode, and a wiring layer PL having a plurality of wirings PLa. In the back-side illuminated imaging device D, when the wiring layer PL side is set to the front-side of the wafer W, the photoelectric conversion unit PD receives light incident from the back-side of the wafer W through an on-chip lens L and a color filter F. The color filter F includes a red color filter FR, a blue color filter FB, and a green color filter FG.

Further, electrodes E are formed on a surface Da of the back-side illuminated imaging device D, i.e., on a surface of the wafer W. The electrodes E are electrically connected to the wirings PLa of the wiring layer PL. The wirings PLa are provided to input an electric signal to an internal circuit element of the back-side illuminated imaging device D or to output the electric signal from the internal circuit element to the outside of the back-side illuminated imaging device D.

First Embodiment

Next, an inspection apparatus according to the first embodiment of the present disclosure will be described.

Figure 3:
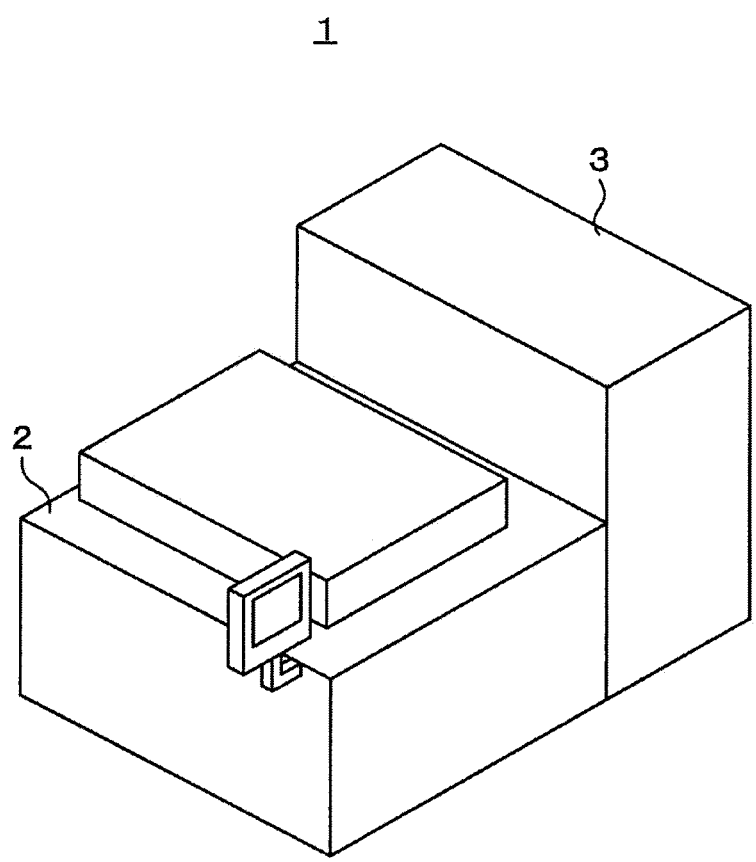
FIG. 3 is a perspective view schematically showing a configuration of an inspection apparatus according to a first embodiment of the present disclosure.
Figure 4:
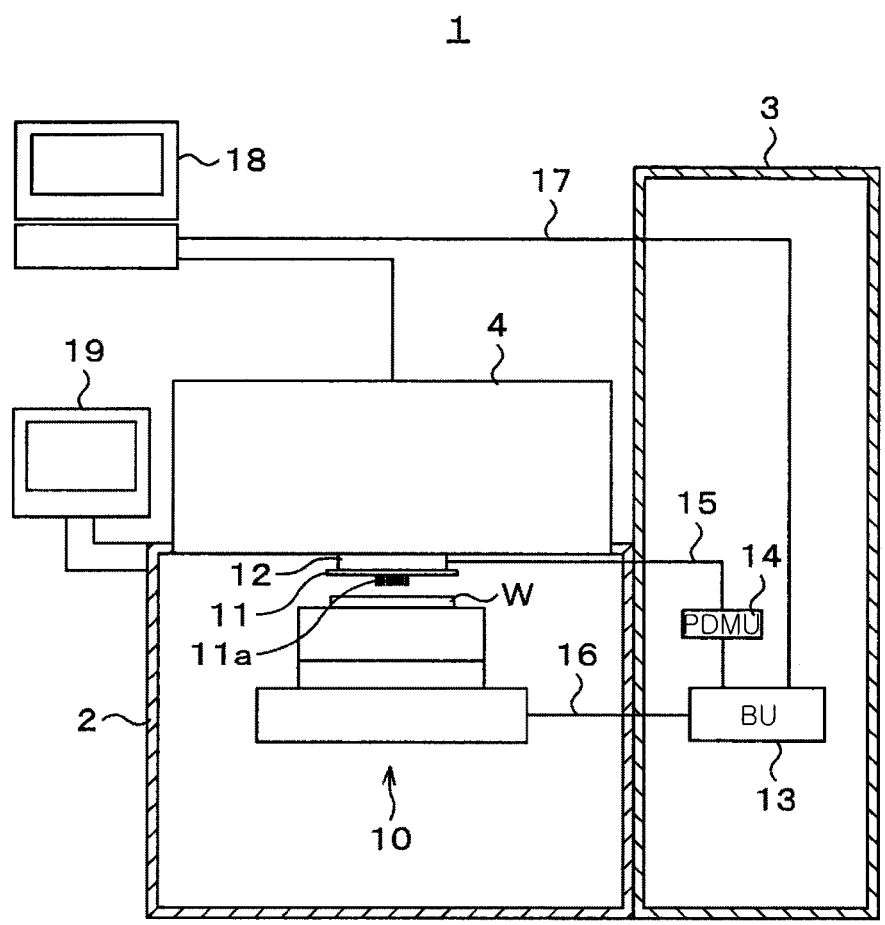
FIG. 4 is a front view schematically showing the configuration of the inspection apparatus according to the first embodiment of the present disclosure.

FIGS. 3 and 4 are a perspective view and a front view, respectively, which schematically show a configuration of a prober 1 serving as an inspection apparatus according to the first embodiment of the present disclosure. In FIG. 4, a cross section of a part of the prober 1 shown in FIG. 3 is illustrated so that components of an accommodating chamber and a loader that will be described later can be shown.

The prober 1 is configured to inspect electrical characteristics of a plurality of back-side illuminated imaging devices D (hereinafter, simply referred to as "imaging devices D") formed on the wafer W that is an inspection object. As shown in FIGS. 3 and 4, the prober 1 includes an accommodating chamber 2, a loader 3 disposed adjacent to the accommodating chamber 2, and a tester 4 disposed to cover the accommodating chamber 2.

The accommodating chamber 2 is a hollow housing and has a stage 10 on which the wafer W is supported. The stage 10 is configured to attract and hold the wafer W so that the position of the wafer W with respect to the stage 10 is not shifted. The stage 10 is further configured to be movable in a horizontal direction and a vertical direction and adjust a relative position between the wafer W and a probe card 11 to be described later to bring the electrodes E on the surface of the wafer W into contact with probes 11a of the probe card 11.

Further, the probe card 11 is disposed above the stage 10 in the accommodating chamber 2 to be opposed to the stage 10. The probe card 11 has the needle-shaped probes 11a formed to correspond to the electrodes E on the surface of the wafer W. The probe 11a is an example of a contact terminal of the present disclosure.

The probe card 11 is connected to the tester 4 through an interface 12. When the probes 11a are brought into contact with the electrodes E of the imaging devices D of the wafer W, the probes 11a supply a power from the tester 4 to the imaging devices D through the interface 12 or transmit signals from the imaging devices D to the tester 4 through the interface 12.

The loader 3 is configured to extract a wafer W accommodated in a FOUP (not shown) that is a transfer container and transfer the wafer W to the stage 10 in the accommodating chamber 2. Further, the loader 3 is configured to receive from the stage 10 the wafer W having the imaging devices D of which electrical characteristics are inspected and stores the wafer W in the FOUP.

The loader 3 includes a base unit (BU) 13 that is a controller configured to control a power supply and the like, and a potential difference measuring unit (PDMU) 14 configured to measure a potential difference in a potential difference generating circuit (not shown) in each back-side illuminated imaging device D. The potential difference generating circuit is, e.g., a diode, a transistor, or a resistor. The potential difference measuring unit 14 is connected to the interface 12 through a wiring 15, acquires a potential difference between two probes 11a in contact with two electrodes E corresponding to the potential difference generating circuit, and transmits the acquired potential difference to the base unit 13. The connection structure of the probes 11a and the wiring 15 in the interface 12 will be described later. The base unit 13 is connected to the stage 10 through a wiring 16 and controls an operation of irradiating light from a light irradiation mechanism 40 to be described later or an operation of flowing a coolant in a substrate support 30 to be described later. The base unit 13 and the potential difference measuring unit 14 may be disposed in the accommodating chamber 2. Alternatively, the potential difference measuring unit 14 may be disposed at the probe card 11. The base unit 13 is connected to a tester computer 18 to be described later through a wiring 17 and controls the light irradiation mechanism 40 to be described later based on an input signal from the tester computer 18.

The tester 4 has a test board (not shown) for reproducing a part of a circuit configuration of a motherboard on which the imaging devices D are installed. The test board is connected to the tester computer 18 configured to determine whether the imaging devices D are defective or non-defective based on signals from the imaging devices D. The tester 4 can reproduce multiple types of motherboard circuit configurations by replacing the test board.

The prober 1 further includes a user interface unit 19. The user interface unit 19 displays information for a user or allows a user to input instructions. The user interface unit 19 is, e.g., a display panel having a touch panel, a keyboard, or the like.

In the prober 1 having the above-described components, when the electrical characteristics of the imaging devices D are inspected, the tester computer 18 transmits data to the test board connected thereto through the imaging devices D and the probes 11a. Then, the tester computer 18 determines whether or not the transmitted data has been correctly processed by the test board based on the electric signals from the test board.

Figure 5:
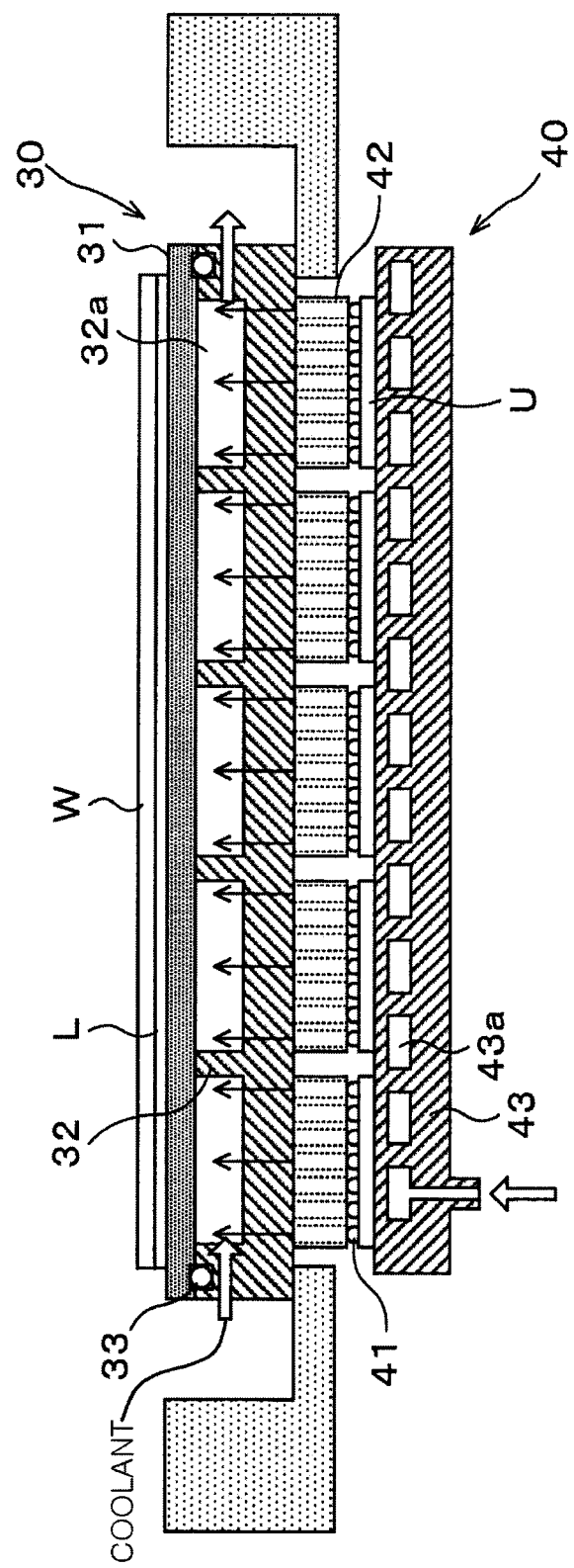
FIG. 5 is a cross-sectional view schematically showing a configuration of a stage.

Next, the configuration of the stage 10 will be described. FIG. 5 is a cross-sectional view schematically showing the configuration of the stage 10.

As shown in FIG. 5, the stage 10 includes the substrate support 30 and the light irradiation mechanism 40 in that order from the top.

The wafer W is supported on the substrate support 30 such that the back surfaces of the imaging devices D face the substrate support 30. The substrate support 30 has an upper lid 31 as a first member disposed on the wafer W side and a base member 32 as a second member disposed on the light irradiation mechanism 40 side. Both of the upper lid 31 and the base member 32 are made of a light-transmissive material. The upper lid 31 and the base member 32 are in contact with each other via an O-ring 33. A coolant channel 32a formed by the base member 32 and the upper lid 31, which will be described later, is sealed by the O-ring 33.

The light irradiation mechanism 40 is disposed to be opposite to the wafer W supported on the substrate support with the substrate support 30 interposed between the light irradiation mechanism 40 and the wafer W. The light irradiation mechanism 40 has a plurality of LEDs 41 such that the light emitted from the LEDs is oriented toward the wafer W.

The light irradiation mechanism 40 has a collimator 42 configured to change light from the LEDs 41 into parallel light and a base 43 on which the LEDs 41 are installed.

The collimator 42 is, e.g., a flat member having a through hole whose periphery is covered with a black body, or a lens member such as a ball lens or a non-spherical lens.

The base 43 has therein a water passage 43a through which water for cooling the LED 41 flows.

The light emitted from the LEDs 41 of the light irradiation mechanism 40 is changed to parallel light by the collimator 42 and passes through the base member 32 made of the light-transmissive material. The light that has passed through the base member 32 passes through a coolant that is a light-transmissive liquid flowing through the coolant channel 32a to be described later and passes through the upper lid 31 made of the light-transmissive material. Then, the light enters the back surfaces of the imaging devices D.

Figure 6:
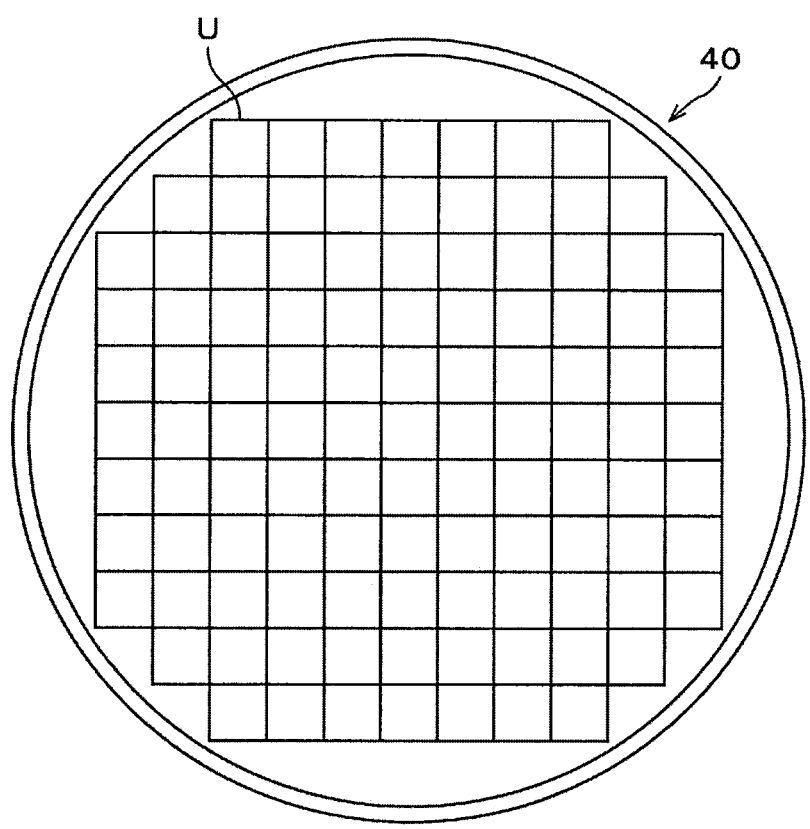
FIG. 6 is a top view schematically showing a configuration of a light irradiation mechanism.
Figure 7:
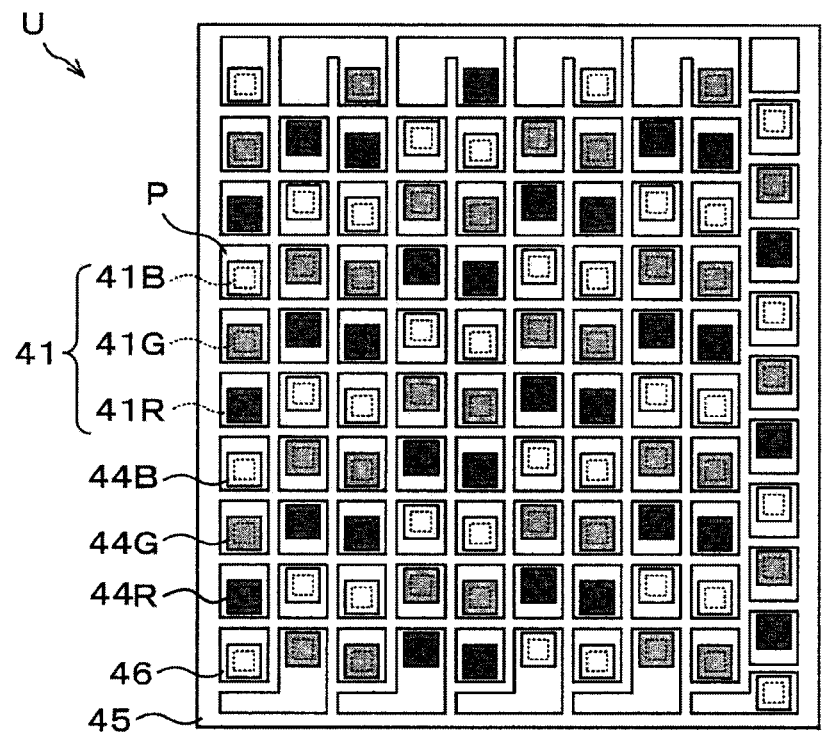
FIG. 7 is a top view schematically showing a configuration of an LED unit of the light irradiation mechanism.

Next, the configuration of the light irradiation mechanism 40 will be described. FIG. 6 is a top view schematically showing the configuration of the light irradiation mechanism 40. The illustration of the collimator 42 is omitted in FIG. 6. FIG. 7 is a top view of an LED unit U of the light irradiation mechanism 40 that will be described later.

As shown in FIG. 6, the light irradiation mechanism 40 has the same number of LED units U as the number of the imaging devices D (see FIG. 1) formed on the wafer W. As shown in FIG. 7, each LED unit U has a plurality of LEDs 41.

The LEDs 41 of the LED unit U include LEDs that emit light of different wavelengths. For example, the LEDs 41 include red LEDs 41R, blue LEDs 41B, and green LEDs 41G. The red LEDs 41R, the blue LEDs 41B, and the green LEDs 41G are installed on the wiring pattern P to be alternately arranged. The LEDs 41 are separately controlled depending on, e.g., colors.

The red LEDs 41R are arranged such that the light beams from the LEDs 41R are received by all of the photoelectric conversion units PD of the imaging device D where red color filters FR are disposed. Similarly, the blue LEDs 41B are arranged such that the light beams from the LEDs 41B are received by all of the photoelectric conversion units PD of the imaging device D where blue color filters FB are disposed. The green LEDs 41G are arranged such that the light beams from the LEDs 41G are received by all of the photoelectric conversion units PD of the imaging device D where green color filters FG are disposed.

Alternatively, the red LEDs 41R may be arranged such that the light beams from the LEDs 41R are received by the entire photoelectric conversion units PD of the imaging device D. Similarly, the blue LEDs 41B may be arranged such that the light beams from the blue LEDs 41B are received by the entire photoelectric conversion units PD of the imaging device D. The green LEDs 41G may be arranged such that the light beams from the green LEDs 41G are received by the entire photoelectric conversion units PD of the imaging device D.

A red-transmitting filter 44R is disposed above the red LED 41R, i.e., between the LED 41R and the substrate support 30, to transmit light having a wavelength range that is narrower than and included in the wavelength range of the red LED 41R. A blue-transmitting filter 44B is disposed above the blue LED 41B to transmit light having a wavelength range that is narrower than and included in the wavelength range of the blue LED 41B. A green-transmitting filter 44G is disposed above the green LED 41G to transmit light having a wavelength range that is narrower than and included in the wavelength range of the green LED 41G.

The red-transmitting filter 44R, the blue-transmitting filter 44B, and the green-transmitting filter 44G may be, e.g., a film in which a dielectric film having a controlled thickness is formed on a glass film, or may be a film having a refractive index that is changed when a voltage is applied.

In the LED unit U, the LEDs 41 are installed on a wiring pattern 46 formed on a surface of a flat base 45. The base 45 is formed by forming an insulating film such as a titanium oxide film on a surface of a flat plate made of a metal such as copper, for example. The wiring pattern 46 is made of, e.g., a copper material.

Figure 8:
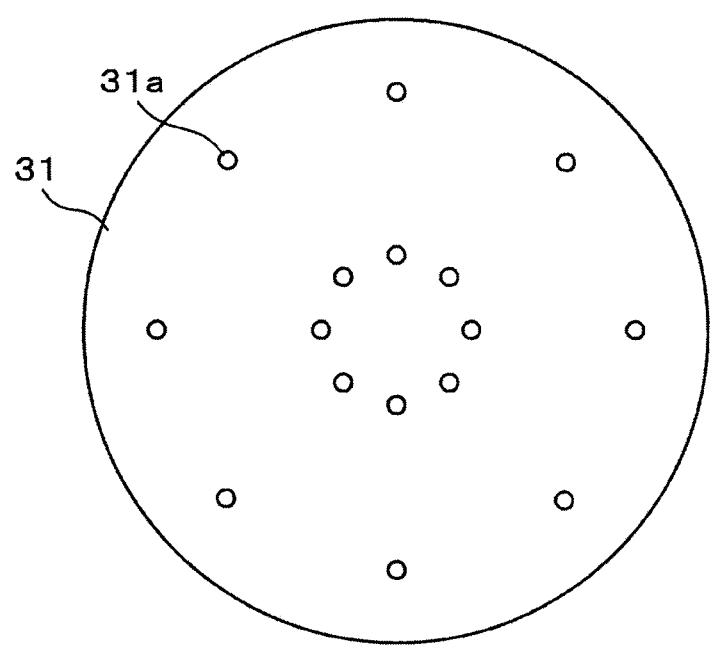
FIG. 8 is a top view schematically showing a configuration of an upper lid.
Figure 9:
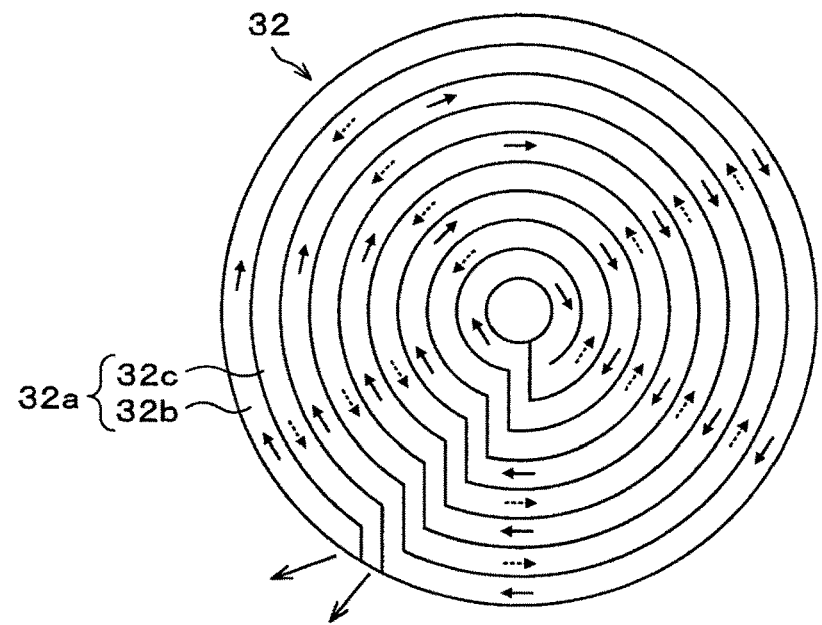
FIG. 9 is a top view schematically showing a configuration of a base member.

Next, the configuration of the substrate support 30 will be described. FIG. 8 is a top view of the upper lid 31 of the substrate support 30. FIG. 9 is a top view of the base member 32.

As shown in FIG. 8, the upper lid 31 is formed in a disk shape and has on an upper surface thereof, i.e., a top surface thereof, attraction holes 31a for attracting the wafer W thereon. The attraction holes 31a communicate with suction holes (not shown) formed on the side portion of the upper lid 31. The wafer W can be attracted to the upper lid 31, i.e., the substrate support 30, by performing suction through the suction holes by a pump (not shown). The attraction holes 31a are formed in a region where the imaging devices D are not located above the attraction holes 31a when the wafer W is mounted on the upper lid 31.

As shown in FIG. 9, the base member 32 is formed in a disk shape similar to the upper lid 31, and a groove through which a coolant flows into the substrate support 30 is formed on an upper surface thereof. By covering the groove with the upper lid 31, the coolant channel 32a is formed. The groove is formed such that a coolant supply channel 32b and a coolant return channel 32c are disposed alternately along a radial direction. Accordingly, it is possible to prevent a temperature gradient from forming in the substrate support 30.

A colorless and light-transmissive liquid such as water or Galden (Registered Trademark) can be used, for example, for the coolant flowing through the coolant channel 32a formed by the upper lid 31 and the base member 32. Such a coolant is supplied to the coolant channel 32a by a pump (not shown) provided at the outside of the prober 1. A flow rate control valve or the like is disposed between the pump and the substrate support 30, so that the flow rate or the temperature of the coolant supplied to the coolant channel 32a can be controlled. The operation of the flow rate control valve or the like is controlled by the base unit 13.

In order to adjust the temperature of the wafer W supported on the upper lid 31, i.e., the substrate support 30, using the coolant flowing through the coolant channel 32a, the upper lid 31 is made of a light-transmissive material having a higher thermal conductivity than that of the wafer W and the base member 32 is made of a light-transmissive material having a lower thermal conductivity than that of the wafer W. For example, the upper lid 31 may be made of sapphire, gallium nitride, or silicon carbide, and the base member 32 may be made of quartz, polycarbonate, polyvinyl chloride, acrylic resin, or glass.

As described above, in the prober 1, the temperature of the wafer W supported on the substrate support 30 is controlled by the coolant flowing through the coolant channel 32a. For the temperature control, the prober 1 measures the temperature of the wafer W.

Figure 10:
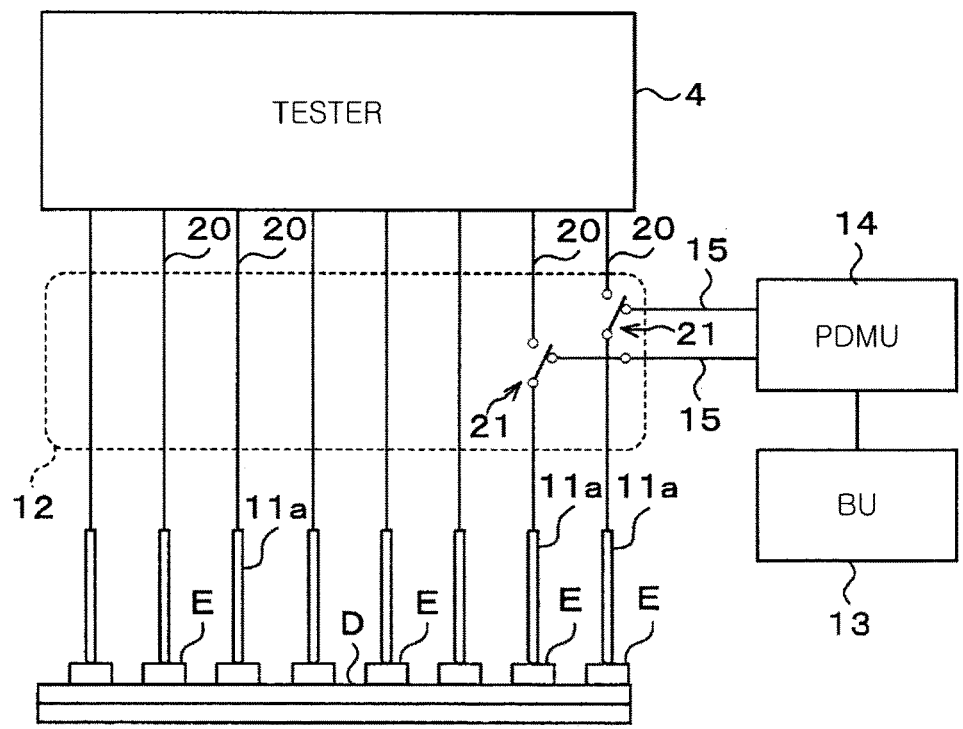
FIG. 10 schematically shows a configuration of a circuit for measuring a temperature of a wafer in the inspection apparatus shown in FIG. 3.

FIG. 10 schematically shows a configuration of a circuit for measuring the temperature of the wafer W in the prober 1.

In the prober 1, as shown in FIG. 10, the probes 11a are connected to the tester 4 by a plurality of wirings 20 disposed in the interface 12. Among the plurality of wirings 20, a relay 21 is provided for each of two wirings 20 that connects the tester 4 and two probes 11a in contact with two electrodes E of the potential difference generating circuit (e.g., diode) in the imaging device D.

Each relay 21 is configured to transmit a potential of a corresponding electrode E to either the tester 4 or the potential difference measuring unit 14. For example, when the electrical characteristics of the imaging device D are inspected, a potential of each electrode E is transmitted to the potential difference measuring unit 14 at a predetermined timing after a voltage is applied to each electrode E at the time of mounting the electrode E. It is known that the potential difference that is generated when a predetermined current flows in the potential difference generating circuit varies depending on the temperature. Therefore, the temperature of the imaging device D can be measured in real time during the inspection based on the potential difference of the potential difference generating circuit of the imaging device D, i.e., based on the potential difference between the two electrodes E (two probes 11a) of the potential difference generating circuit. In the prober 1, the potential difference measuring unit 14 acquires the potential difference of the potential difference generating circuit of the imaging device D based on the respective potentials of the electrodes E transmitted through the relays 21, and transmits the acquired potential difference to the base unit 13. The base unit 13 measures the temperature of the imaging device D based on the received potential difference and the temperature characteristics of the potential difference of the potential difference generating circuit. Further, the base unit 13 adjusts the conditions of the coolant such as the temperature and the flow rate of the coolant flowing through the coolant channel 32a based on the measured temperature of the imaging device D to control the temperature of the wafer W, thereby controlling the temperature of the imaging device D that is an inspection target to a desired value. In other words, the base unit 13 functions as a temperature control unit of the present disclosure.

The method of measuring the temperature of the imaging device D is not limited to the above and may be any other method as long as the temperature of the imaging device D can be measured.

Next, an example of an inspection process on the wafer W using the prober 1 will be described.

First, the wafer W is extracted from the FOUP of the loader 3 and transferred to the stage 10. The wafer W is supported on the stage 10 such that the back surfaces of the back-side illuminated imaging devices D face the stage 10.

Next, the stage 10 is moved, and the probes 11a disposed above the stage 10 and the electrodes E of the wafer W are brought into contact with each other.

Then, light is irradiated from the light irradiation mechanism 40 and signals for inspection are inputted to the probes 11a. Accordingly, the inspection of the back-side illuminated imaging devices D is performed. During the inspection, the potential difference generated by the potential difference generating circuit of the imaging device D is measured by the potential difference measuring unit 14, and the temperature of the imaging device D is measured by the base unit 13 based on the potential difference. Further, the condition of the coolant flowing through the coolant channel 32a is adjusted based on the measured potential difference. Accordingly, the temperature of the imaging device D is controlled to a desired value. Thereafter, the above-described processes are repeated until the inspection of all the back-side illuminated imaging devices D is completed.

In accordance with the present embodiment, the back-side illuminated imaging devices D can be inspected by the configuration in which the substrate support 30, on which the wafer W is supported such that the back surfaces of the back-side illuminated imaging devices D face the substrate support 30, is made of a light-transmissive material and the light is irradiated from the light irradiation mechanism 40 disposed to be opposite to the wafer W with the substrate support 30 interposed between the light irradiation mechanism 40 and the wafer W. Further, by employing such a configuration, the number of the probes 11a is not limited and, thus, the inspection can be performed quickly. Further, the light source of the light irradiation mechanism 40 includes the plurality of LEDs 41, so that it is possible to adjust the light irradiation conditions of the light irradiation mechanism 40 by, for example, changing the voltages to be applied to the LEDs 41. Since the light can output a stable amount of light after the adjustment, the prober 1 does not require a complicated optical system.

Further, in the present embodiment, the substrate support 30 has the coolant channel 32a through which the coolant that can transmit the light from the LEDs 41 flows, and the condition of the coolant such as the temperature of the coolant or the like is adjusted by the base unit 13 to control the temperature of the imaging device D, i.e., the temperature of the wafer W. Accordingly, the temperature of the imaging device D that is being inspected can be set to a desired temperature.

Further, in accordance with the present embodiment, the upper lid 31 to be in contact with the wafer W on which the imaging devices D are formed is made of a material having a higher thermal conductivity than that of the wafer W, and the base member 32 is made of a material having a lower thermal conductivity than that of the wafer W. Therefore, the in-plane temperature of the wafer W can be uniform. If the in-plane temperature of the wafer W is not uniform, it is required to correct the condition of the coolant depending on the position of the imaging device D to be inspected on the wafer W. However, if the in-plane temperature of the wafer W is uniform, the above-described correction is unnecessary and the temperature of the wafer W can be easily controlled.

Further, since the upper lid 31 and the base member 32 constituting the substrate support 30 are made of the above-described materials, the thermal capacity of the entire substrate support 30 is small. Therefore, it is possible to increase the responsiveness from when the condition of the coolant flowing through the substrate support 30 is controlled to when the temperature of the substrate support 30 is changed.

Further, in accordance with the present embodiment, the light irradiation mechanism 40 includes the collimator 42, so that the light beams from the LEDs 41 can enter the imaging device D as parallel light beams. In a general front-side illuminated probe device, a metal wiring is disposed on a sensor surface, so that it is necessary to tilt the light irradiation mechanism to prevent shadows. Since, however, the amount of light that can be received is reduced due to the tilting, it is necessary to measure the amount of reduction of the light at every tilting in order to perform the inspection with high accuracy.

Even when the back-side illuminated probe device includes the light irradiation mechanism that does not use parallel light, the light is absorbed by a metal shield disposed between the filters so that the amount of light reaching the sensor becomes unclear. Therefore, in order to perform the inspection with high accuracy, it is necessary to examine the influence of the metal shield disposed between the filters. On the other hand, in the present embodiment, the parallel light is irradiated from the light irradiation mechanism, so that the influence of the metal shield can be suppressed and the inspection efficiency can be improved.

Further, in accordance with the present embodiment, the light irradiation mechanism 40 includes the LEDs 41 that emit light of particular wavelengths. Specifically, the light irradiation mechanism 40 includes the LEDs 41R that emit red light, the LEDs 41B that emit blue light, and the LEDs 41G that emit green light. Therefore, in the present embodiment, a particular wavelength can be set as an inspection wavelength, and the performance of the imaging devices D for the particular wavelength can be inspected.

Further, in accordance with the present embodiment, the filters that transmit only light having predetermined wavelengths among the light emitted from the LEDs 41 are provided. Specifically, the red-transmitting filter 44R, the blue-transmitting filter 44B, and the green-transmitting filter 44G are provided for the red LEDs 41R, the blue LEDs 41B, and the green LEDs 41G, respectively. Therefore, it is possible to examine the performance of the imaging devices D with respect to the light having a band of wavelength narrower than that of the light emitted from the LEDs 41.

In the present embodiment, the light irradiation mechanism 40 irradiates visible light such as red light or the like. However, when the imaging devices D are used for infrared light, the light irradiation mechanism 40 may irradiate light such as infrared light or the like, instead of the visible light.

Second Embodiment

Figure 11:
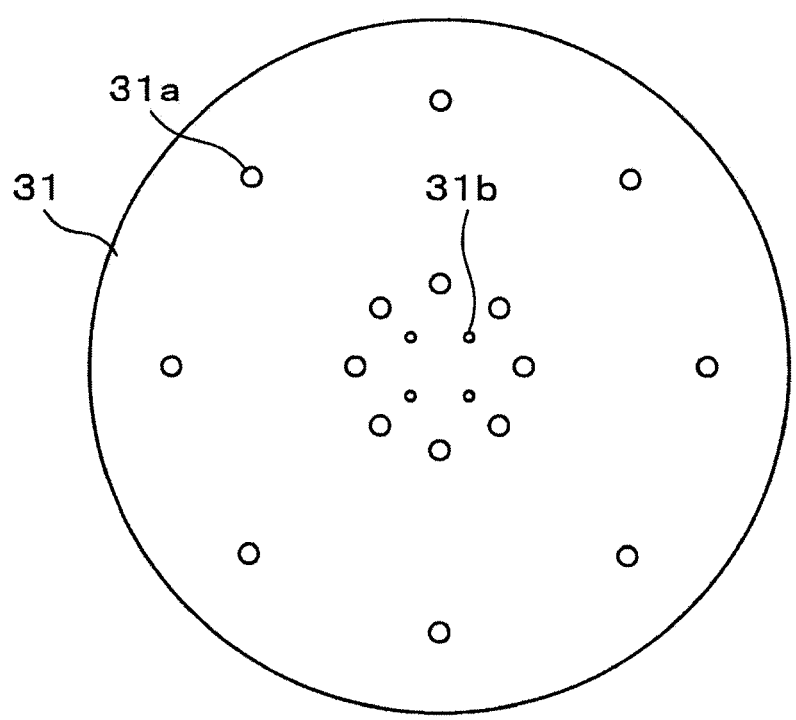
FIG. 11 is a top view schematically showing a configuration of an upper lid according to a second embodiment of the present disclosure.

FIG. 11 is a top view schematically showing the configuration of the upper lid 31 according to a second embodiment of the present disclosure.

As shown in FIG. 11, the upper lid 31 of the present embodiment has, in addition to the suction holes 31a, injection holes 31b serving as a thermal resistance reduction fluid supply unit. A gas having a small molecular weight such as helium gas or hydrogen gas is injected from the injection holes 31b. The injected gas is supplied to the space between the wafer W and the substrate support 30. The contact surface of the wafer W with the substrate support 30 has an uneven shape due to the presence of the on-chip lens L. Therefore, a gap is formed between the wafer W and the substrate support 30. By filling the gap with the gas having a small molecular weight and a high thermal conductivity, the thermal resistance between the wafer W and the substrate support 30 can be reduced. Accordingly, the in-plane temperature of the wafer W can be more uniform.

The injection holes 31b communicate with supply holes (not shown) formed on the side portion of the upper lid 31. The gas supplied from the supply holes is injected from the injection holes 31b. The injection holes 31b are formed in a region where the imaging devices D are not located above the injection holes 31b when the wafer W is supported on the upper lid 31.

Third Embodiment

Figure 12:
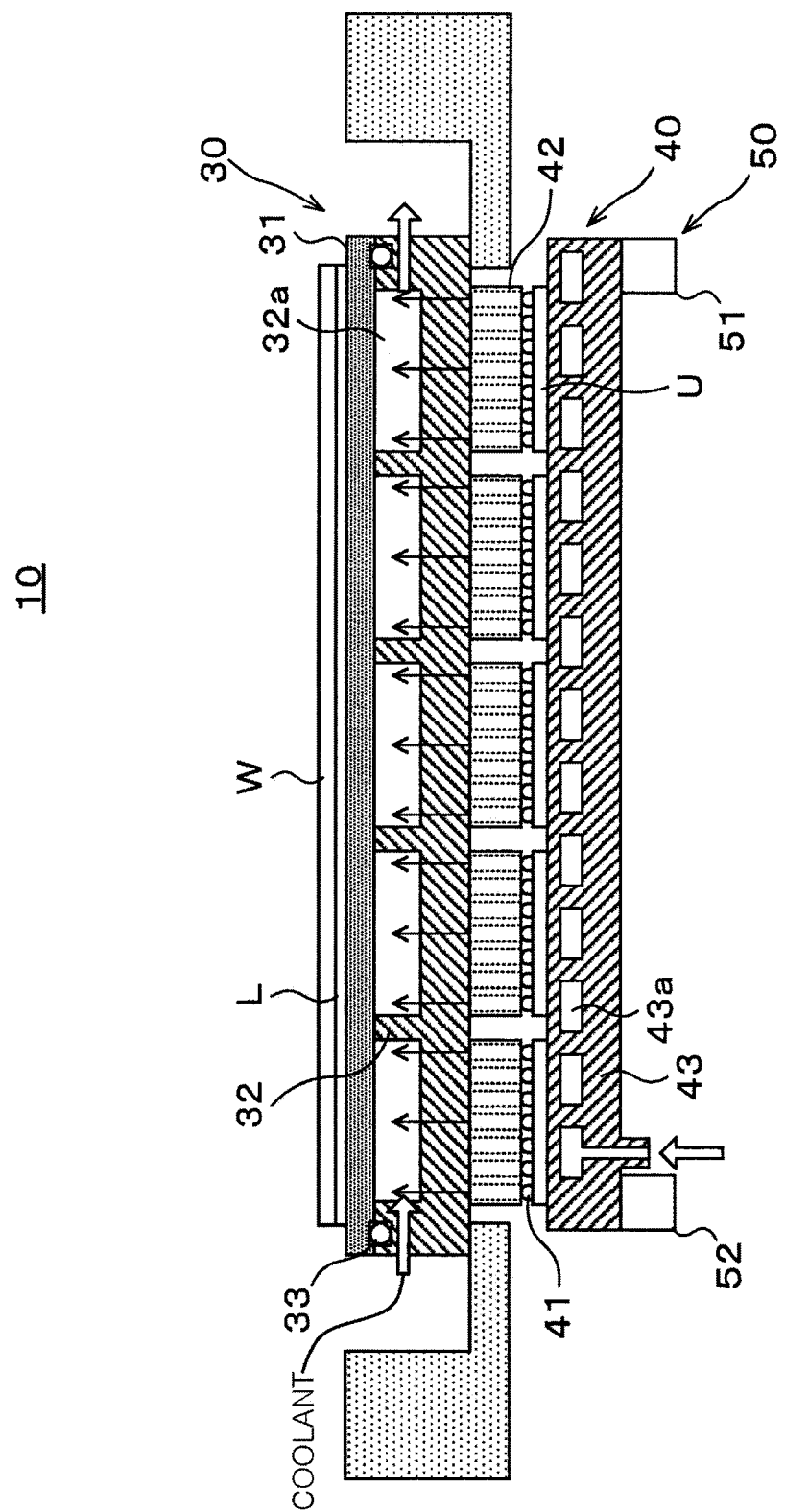
FIG. 12 is a cross-sectional view schematically showing a configuration of a stage according to a third embodiment of the present disclosure.

FIG. 12 is a cross-sectional view schematically showing the configuration of the stage 10 according to a third embodiment of the present disclosure.

As shown in FIG. 12, the stage 10 of the present embodiment includes an angle adjusting mechanism 50 configured to adjust an angle of the light from the light irradiation mechanism 40 with respect to the substrate support 30, i.e., an angle of the light from the light irradiation mechanism 40 to the wafer W on the substrate support 30. The angle adjusting mechanism 50 includes, e.g., a piezo element 51 that supports a bottom portion of one end of the light irradiation mechanism 40, and another piezo element 52 that supports a bottom portion of the other end of the light irradiation mechanism 40. The piezo elements 51 and 52 can be controlled separately. By providing the angle adjusting mechanism 50, it is possible to inspect the directivity of the imaging devices D, i.e., the dependency of the light incident angle for the imaging devices D.

In the above-described embodiments, the temperatures of the imaging devices D are controlled by adjusting the condition of the coolant flowing in the substrate support 30. However, the method of controlling the temperatures of the imaging devices D is not limited thereto. For example, the light irradiation mechanism 40 includes a heating LED, and the imaging devices D are heated by the light emitted from the heating LED. The temperatures of the imaging devices D may be controlled by adjusting the intensity of the light emitted from the heating LED while maintaining the condition of the coolant flowing in the substrate support 30.

Further, in the above-described embodiments, the temperatures of the imaging devices D that are being inspected are measured. Since, however, the wafer W is uniformly heated, the temperatures of the imaging devices D that are not being inspected may be measured. Further, the temperature of the wafer W in a region other than the region where the imaging devices D are formed may be measured.

As above, proper exemplary embodiments of the present disclosure have been described, but the present disclosure is not limited thereto. To a person skilled in the art, it is clear that various changes or modifications may be made within the spirit scope described in the claims, and it is understood that they naturally belong to the technical scope of the present disclosure.

DESCRIPTION OF REFERENCE NUMERALS

1: prober
2: accommodating chamber
3: loader
4: tester
10: stage
11: probe card
11a: probe
12: interface
13: base unit
14: potential difference measuring unit
18: tester computer
19: user interface unit
30: substrate support
31: upper lid
31a: attraction hole
31b: injection hole
32: base member
32a: coolant channel
40: light irradiation mechanism
41: LED
42: collimator
44B: blue-transmitting filter
44G: green-transmitting filter
44R: red-transmitting filter
50: angle adjusting mechanism
D: back-side illuminated imaging device
Da: surface
E: electrode
F: color filter
L: on-chip lens
PD: photoelectric conversion unit
PL: wiring layer
W: wafer

The invention claimed is:

1. An inspection apparatus for inspecting an imaging device formed on an inspection object by bringing a contact terminal into electrical contact with a wiring layer of the imaging device while causing light to enter the imaging device, wherein the light enters the imaging device from a back surface that is a surface on the side opposite to a side on which the wiring layer is formed, the inspection apparatus comprising:
   a substrate support made of a light-transmissive material and on which the inspection object is supported such that the substrate support faces the back surface of the imaging device; and
   a light irradiation mechanism disposed to be opposite to the inspection object with the substrate support interposed therebetween and having a plurality of LEDs such that light from the LEDs is oriented toward the inspection object,
   wherein the substrate support includes a first member disposed on a side of the inspection object and a second member disposed on a side of the light irradiation member and a coolant channel through which a coolant that transmits light from the LEDs flows is formed by the first member and the second member, and
   the first member has a higher thermal conductivity than a thermal conductivity of the inspection object, and the second member has a lower thermal conductivity than the thermal conductivity of the inspection object,
   the inspection apparatus further comprising a temperature control unit configured to control a temperature of the inspection object on the substrate support by adjusting a condition of the coolant.

2. The inspection apparatus of claim 1, wherein the first member is made of sapphire, gallium nitride or silicon carbide.

3. The inspection apparatus of claim 1, wherein the second member is made of quartz, polycarbonate, polyvinyl chloride, acrylic resin or glass.

4. The inspection apparatus of claim 1, further comprising:
   a thermal resistance reduction fluid supply unit configured to supply fluid that reduces thermal resistance between the substrate support and the inspection object to a gap between the substrate support and the inspection object.

5. The inspection apparatus of claim 1, wherein the light irradiation mechanism has a collimator configured to change the light from the LEDs into parallel light, and the light irradiation mechanism irradiates the parallel light to the inspection object.

6. The inspection apparatus of claim 1, further comprising:
   an angle adjusting mechanism configured to adjust an angle of the light irradiation mechanism with respect to the substrate support.

7. The inspection apparatus of claim 1, wherein the LEDs include LEDs that emit light of different wavelengths.

8. The inspection apparatus of claim 1, wherein the light irradiation mechanism irradiates light to the inspection object through a filter that transmits only light having a predetermined wavelength among the light emitted from the LEDs.

\* \* \* \* \*